United States Patent [19]

Iinuma

[11] Patent Number: 4,688,074
[45] Date of Patent: Aug. 18, 1987

[54] CONNECTING STRUCTURE FOR A DISPLAY DEVICE

[75] Inventor: Yoshio Iinuma, Tokorozawa, Japan

[73] Assignee: Citizen Watch Co., Ltd., Tokyo, Japan

[21] Appl. No.: 808,370

[22] Filed: Dec. 13, 1985

Related U.S. Application Data

[63] Continuation of Ser. No. 481,253, Apr. 1, 1983, abandoned.

[30] Foreign Application Priority Data

Apr. 6, 1982 [JP] Japan .................................. 57-057129

[51] Int. Cl.⁴ .................... H01L 23/12; H01L 23/32; H01L 27/20; H01L 21/603
[52] U.S. Cl. ......................................... 357/79; 357/68; 357/73; 357/74; 357/80
[58] Field of Search ..................... 357/79, 73, 74, 68, 357/80; 368/242, 204, 203; 350/332, 331 R, 334, 336

[56] References Cited

U.S. PATENT DOCUMENTS

| | | | |
|---|---|---|---|
| 3,423,638 | 1/1969 | Dix et al. | 357/79 |
| 3,896,544 | 7/1975 | Fosnough | 357/79 |
| 3,978,653 | 9/1976 | Burke et al. | 350/334 |
| 4,012,117 | 3/1977 | Lazzery | 350/334 |
| 4,142,287 | 3/1979 | Grabbe | 357/80 |
| 4,145,120 | 3/1979 | Kubotai | 357/80 |
| 4,183,629 | 1/1980 | Nishimura et al. | 350/331 |
| 4,306,233 | 12/1981 | Westbrook | 350/336 |
| 4,435,046 | 3/1984 | Nishimura | 350/336 |
| 4,514,042 | 4/1985 | Nukii et al. | 350/332 |

FOREIGN PATENT DOCUMENTS

| | | | |
|---|---|---|---|
| 0077684 | 6/1977 | Japan | 357/79 |
| 0133674 | 8/1982 | Japan | 357/71 |

Primary Examiner—Andrew J. James
Assistant Examiner—S. V. Clark
Attorney, Agent, or Firm—Birch, Stewart, Kolasch & Birch

[57] ABSTRACT

A connecting structure for a liquid crystal cell having a pair of glasses including a substrate glass, a liquid crystal material between the glasses, and a number of terminals provided on the substrate glass and electrically connected with display dots formed by the liquid crystal material. An LSI used in the display device has a plurality of terminals corresponding to the terminals on the substrate glass. The LSI is held by a holding plate in a predetermined position and the terminals of the LSI are pressed against the terminals on the substrate glass.

6 Claims, 8 Drawing Figures

PRIOR ART

CONNECTING STRUCTURE FOR A DISPLAY DEVICE

This application is a continuation of application Ser. No. 481,253 filed on Apr. 1, 1983, now abandoned.

BACKGROUND OF THE INVENTION

The present invention relates to a structure for electrically connecting a display device such as a liquid crystal display to a semiconductor device such as an LSI.

The liquid crystal display device is used as a display device for an electronic instrument such as an electronic watch, desk-top computor, television, and others. In recent years, a liquid crystal display having a large number of display dots is required in order to increase the display capacity of the display. However, a large display capacity necessarily causes an increase of the number of the terminals for connecting the liquid crystal display with the semiconductor device. Heretofore, the connection between terminals for the liquid crystal display and terminals for the semiconductor device has been made by a connector comprising a plurality of laminated insulation rubber layers and conductive rubber layers which are alternately disposed. Minimum pitch between the conductive rubber layers is about 500 μm. On the other hand, terminals of such a large capacity display should be disposed at a pitch smaller than 500 μm. If the number of the terminals increase, the number of the terminals per unit area increases. Therefore, it is difficult to utilize such a connector to connect terminals in such a large capacity display device.

SUMMARY OF THE INVENTION

The object of the present invention is to provide a connecting structure which may connect a number of closely disposed terminals of a display with terminals for a semiconductor device.

According to the present invention, there is provided a connecting structure for a display device mounted on a substrate, having a number of terminals provided on the substrate, and electrically connected with display dots formed by the liquid crystal material comprising: at least one semiconductor device having a plurality of terminals corresponding to the terminals on the substrate glass, first means for holding the semiconductor device in a predetermined position and a second means for pressing the terminals of the semiconductor device against the terminals on the substrate glass.

Other objects and features of the present invention will become more apparent from the following description with reference to the accompanying drawings.

DESCRIPTION OF PREFERRED EMBODIMENTS

Figure 1:
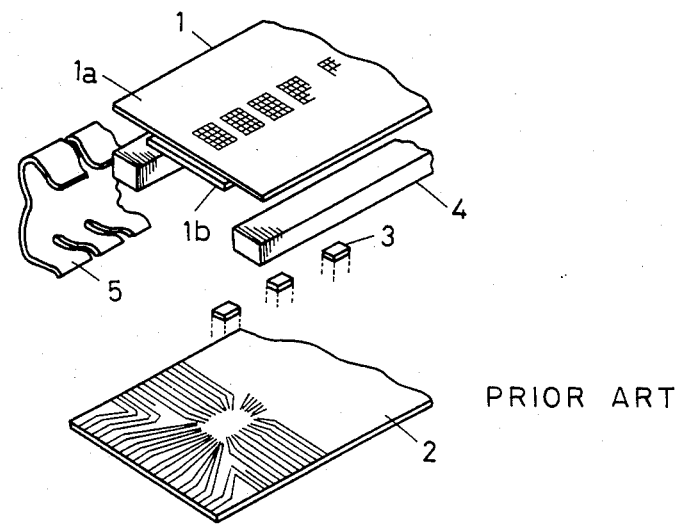
FIG. 1 is an exploded perspective view showing a part of a conventional liquid crystal display device.
Figure 2:
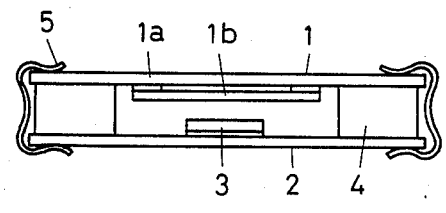
FIG. 2 is an elevational view of the display device of FIG. 1.

Referring to FIGS. 1 and 2 showing a conventional liquid crystal device, the device comprises a liquid crystal cell 1 and a substrate 2. The liquid crystal cell 1 comprises a front glass 1a, a back glass 1b and liquid-crystal material between the glasses, which has 40 words display portions. On the substrate 2, integrated circuits (ICs) 3 are provided by bonding for driving the liquid crystal cell 1. Terminals on the front glass 1a are electrically connected with terminals on the substrate 2 by a pair of connectors 4, and the liquid crystal cell 1 and substrate 3 are assembled by clampers 5. In such a display device, pitch between terminals is 500 μm or more and the number of the terminal is 200 to 300. Accordingly, the terminals on the glass 1a and substrate 2 can be connected by the connectors 4 comprising a plurality of conductive rubber layers.

On the other hand, a large capacity display device having 20 rows, each row comprising 40 words, the pitch between terminals is about 100 μm and the number of the terminals is more than 1000. Therefore, terminals of such a device can not be connected by the connector 4.

Figure 3:
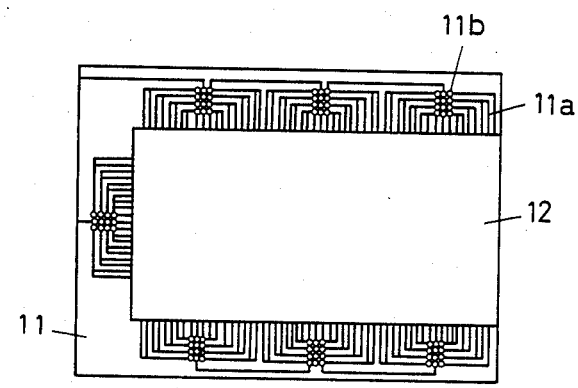
FIG. 3 is a plan view of a liquid crystal cell in which a number of terminals are closely disposed in order to increase the display capacity.
Figure 4:
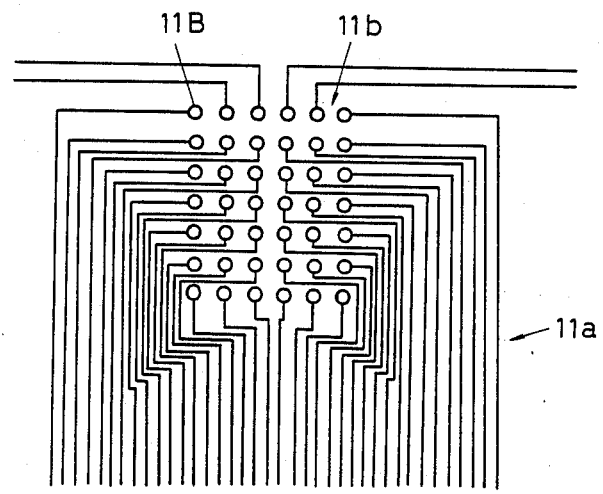
FIG. 4 is a plan view showing a terminal portion of the liquid crystal cell of FIG. 3.

Referring to FIG. 3, there is illustrated a liquid crystal cell having a large display capacity, which comprises a front glass 11 as a substrate, a back glass 12, a connecting lead portion 11a comprising a plurality of leads printed on the substrate glass 11, and terminal portions 11b for the connecting of LSIs. FIG. 4 shows one of terminal portions 11b. There are provided a number of terminals 11B which are disposed at small pitches of 300–500 μm. Pitch between printed leads of connecting lead portion 11a is smaller than 100 μm.

Figure 5:
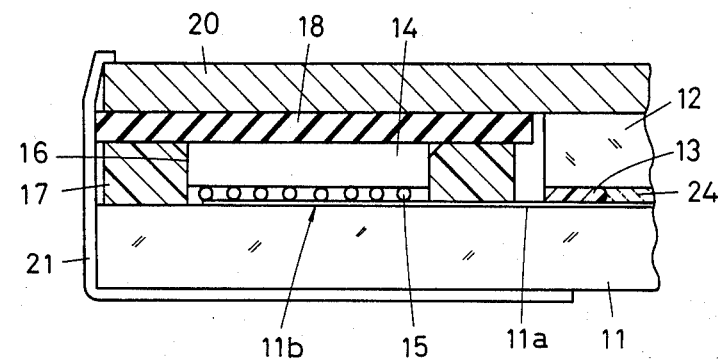
FIG. 5 is a sectional view showing a part of a liquid crystal display device according to the present invention.

Referring to FIG. 5, the liquid crystal cell comprises a liquid-crystal material 24 sealed by a seal 13 between front and back glasses 11 and 12. The liquid-crystal material forms a number of display dots. On the terminal portion 11b, LSI 14 is disposed. The LSI 14 has a plurality of projected electrodes or terminals 15, engaged with an opening 16 of a holding plate 17 made of plastic. The holding plate 17 is secured to the substrate glass 11 by adhesives, so that the LSI is held at a predetermined position. The terminals 15 are arranged in the same arrangement of terminals 11B on the substrate glass 11, so that each terminal 15 coincides with corresponding terminal 11B. Rear sides of the LSI 14 and holding plate are flush with each other and are engaged with a rubber plate 18. A back plate 20 is engaged with the rubber plate 18 and back glass 12. A clamping frame 21 is engaged with the back plate 20 and substrate glass to assemble the display device, so that each terminal 15 is pressed against a corresponding terminal 11B to establish an electrical connection between the display dot in the liquid crystal cell and the LSI 14.

The back plate 20 may be made as a reflector. Although each projected electrode 15 may be a metal bump such as Au bump or Pb-Sn bump, it can be formed by a projection of conductive rubber. Such conductive rubber electrodes ensure the electrical connection, even if there are irregular heights of the electrodes. Further, if the clamping frame 21 is disengaged from the device, a defective LSI can be replaced with a good one. Since the LSI 14 is in an airtight enclosure constructed by the substrate glass 11, holding plate 17 and rubber plate 18, the quality of the LSI can be maintained.

Figure 6:
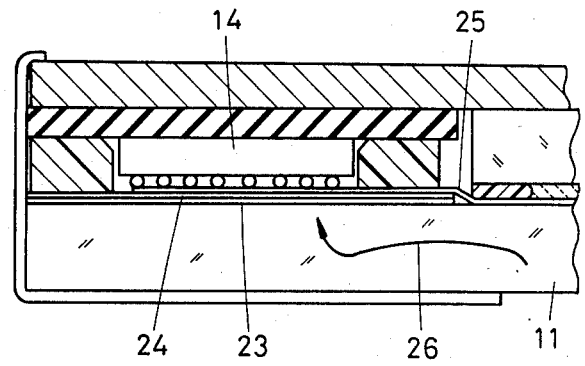
FIG. 6 is a sectional view of another embodiment of the present invention.

Referring to FIG. 6 showing another embodiment of the present invention, a metal shield film 23 is formed on the substrate glass 11 in order to shield the LSI 14 from light. Formed on the shield film 23 is an insulation film 24 on which printed leads 25 and terminals like those of FIG. 4 are provided. In accordance with this embodiment, the LSI is shielded from light entering into the device as shown by an arrow 26. It will be understood that the LSI can also be shielded only by the insulation film 24 without the shield film 23. Further, it is possible to form a shield film on the LSI, eliminating the shield film and insulation film.

Figure 7:
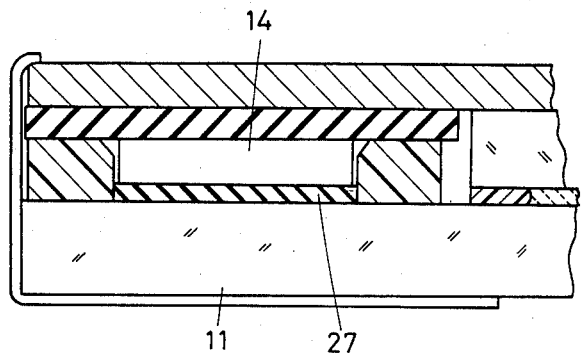
FIG. 7 is a sectional view of another embodiment of the present invention.

Referring to FIG. 7, the LSI 14 is not provided with projected electrode terminals, but flat terminals. Between the LSI and the substrate 11, a pressure-conductive rubber 27 is disposed. The pressure-conductive rubber comprises carbon fibers included in silicon rubber in random arrangement. When the rubber is compressed, the rubber becomes conductive. Therefore, the terminals of the LSI are electrically connected to the terminals on the substrate by the pressure-conductive rubber 27. If a pigment is mixed with the silicon rubber, the pressure-conductive rubber 27 has a shield effect.

Figure 8:
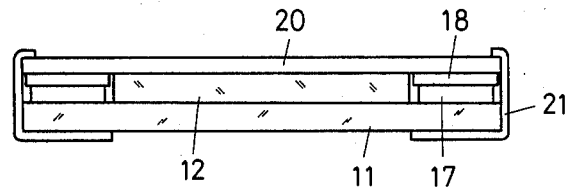
FIG. 8 is an elevational view of a liquid crystal device according to the present invention.

As shown in FIG. 8, the display device according to the present invention can be made into a thin construction and small size compared with the device of FIG. 2, since the terminals of the LSIs are directly connected with terminals on the substrate glass 11.

While the invention has been described in conjunction with preferred specific embodiments thereof, it will be understood that this description is intended to illustrate and not limit the scope of the invention, which is defined by the following claims.

What is claimed is:

1. A connecting assembly comprising:
    a liquid crystal display device having a first front glass substrate, a second back glass substrate overlying said first front glass substrate, a liquid crystal material provided between said first and second glass substrates, said first front glass substrate having a peripheral portion which extends on three sides thereof beyond a periphery of said second back glass substrate;
    a plurality of terminals provided on an upper surface of said first glass substrate on said peripheral portion of said substrate which extends beyond the periphery of said second glass substrate in a matrix arrangement at a pitch between 300 and 500 μm;
    a plurality of leads provided on said upper surface of said first front glass substrate, electrically connecting said liquid crystal display device with said terminals;
    a holding member secured on said peripheral portion of said first glass substrate surrounding said terminals;
    a LSI semiconductor having a plurality of terminals superimposed over and corresponding to said plurality of terminals on said upper surface of said first glass substrate, said LSI semiconductor held by said holding member;
    an elastic plate mounted on said LSI semiconductor and corresponding holding member having an upper surface substantially flush with an upper surface of said second glass substrate;
    a back plate mounted on the respective upper surfaces of said elastic plate and said second glass substrate; and
    a detachable clamping means for pressing said back plate respectively against said elastic plate and second glass substrate whereby said terminals of said LSI semiconductor are pressed against said corresponding terminals of said liquid crystal display device on said upper surface of said first glass substrate.

2. The connecting assembly according to claim 1, wherein each of said terminals of said LSI semiconductor is formed as a projection.

3. The connecting assembly according to claim 1, wherein said elastic plate comprises a rubber plate, said back plate covers the entire display device and said clamping means is a frame for holding the respective components of said assembly together.

4. The connecting assembly according to claim 1, further including a pressure-conductive rubber disposed between said terminals of said LSI semiconductor and terminals on said substrate so as to electrically connect said corresponding terminals with each other.

5. The connecting assembly according to claim 1, further including means for shielding said LSI semiconductor against light.

6. The connecting assembly according to claim 1, wherein said holding member is a plastic plate provided with an opening for housing said LSI semiconductor.

* * * * *